United States Patent [19]
Odake

[11] Patent Number: 6,166,711
[45] Date of Patent: Dec. 26, 2000

[54] PLASMA ADDRESSED ELECTRO-OPTICAL DISPLAY

[75] Inventor: Ryota Odake, Tokyo, Japan

[73] Assignee: Sony Corporation, Tokyo, Japan

[21] Appl. No.: 08/987,238

[22] Filed: Dec. 9, 1997

[30] Foreign Application Priority Data

Dec. 9, 1996 [JP] Japan ................................. 8-328941

[51] Int. Cl.[7] ........................................................ G09G 3/28
[52] U.S. Cl. ........................... 345/60; 345/206; 313/583
[58] Field of Search ............................. 345/50, 206, 104, 345/60, 39, 89; 349/38, 39, 67, 149, 150, 152; 313/584, 583; 315/169.4; 359/87, 59, 54; 257/59, 61

[56] References Cited

U.S. PATENT DOCUMENTS

| | | | |
|---|---|---|---|
| 5,162,901 | 11/1992 | Shimada et al. ........................ | 359/59 |
| 5,260,624 | 11/1993 | Kim et al. ............................... | 313/485 |
| 5,670,974 | 9/1997 | Ohba et al. .............................. | 345/68 |
| 5,684,362 | 11/1997 | Togowa ................................... | 313/584 |
| 5,777,610 | 7/1998 | Sugimoto et al. ...................... | 345/206 |

*Primary Examiner*—Steven J. Saras
*Assistant Examiner*—Tewolde Mengisteab
*Attorney, Agent, or Firm*—Hill & Simpson

[57] ABSTRACT

A plasma addressed electro-optical display which is capable of uniforming coupled capacities of adjacent electrodes even if a drive substrate is connected to a display panel through a plurality of circuit boards so that a high-quality image is displayed. The plasma addressed electro-optical display according to the present invention has dummy electrodes formed on each of outermost electrodes of circuit boards disposed adjacent to connection portions so as to be connected to each of outermost electrodes of the other circuit boards adjacent to the connection portions.

3 Claims, 4 Drawing Sheets

PLASMA ADDRESSED ELECTRO-OPTICAL DISPLAY

BACKGROUND OF THE INVENTION

1. Field of the Invention

The present invention relates to a plasma addressed electro-optical display having a drive substrate connected to an image display panel thereof through a circuit board, and more particularly to uniform capacitances of adjacent electrodes.

2. Description of Prior Art

A so-called plasma addressed electro-optical liquid crystal panel, such as a liquid crystal panel and a plasma display, must have drive electrodes formed into matrix configuration to correspond to pixels. The drive electrodes are generally disposed over the width of the display panel.

The drive electrodes must be electrically connected with an external drive circuit. Hitherto, the display panel and the drive substrate have been connected to each other through a flexible circuit board.

When a large display panel is manufactured, establishment of the connections to all of the drive electrodes on one flexible circuit board is not a practical idea. Thus, the drive electrodes are sectioned into a plurality of electrode groups which are connected as described above on a plurality of flexible circuit boards.

The coupled capacitances of electrodes of a flexible circuit board will now be considered. Since the distances between electrodes are substantially constant on he same flexible circuit board, the coupled capacitances are substantially the same between the adjacent electrodes.

If a plurality of flexible circuit boards are used to establish the connection as described above, the coupled capacitances of adjacent electrodes are undesirably reduced at the outermost electrodes on the adjacent flexible circuit boards.

The reason for this lies in that the distance between electrodes is elongated between adjacent flexible circuit boards as compared with the distance on the same flexible circuit board.

If the coupled capacitances of the adjacent electrodes are different from each other, the waveform of the voltage which is applied to the drive electrode of the display panel becomes different in only the foregoing portion. It leads an influence of the capacitance difference on the displayed image in the boundary between the flexible circuit boards. In particular, a plasma addressed electro-optical display is considerably affected by the difference. As a result, undesirable lines appear in the image frame.

OBJECT AND SUMMARY OF THE INVENTION

In view of the foregoing, an object of the present invention is to provide a plasma addressed electro-optical display which provides uniform coupled capacitances of adjacent electrodes even if a drive substrate is connected to a display panel through a plurality of circuit boards so that a high-quality image is displayed. The plasma addressed electro-optical display according to the present invention has dummy electrodes formed on each of outermost electrodes of circuit boards disposed adjacent to connection portions so as to be connected to each of outermost electrodes of the other circuit boards adjacent to the connection portions.

The plasma addressed electro-optical display according to the present invention may have a structure that a dummy electrode is formed on the outside of an outermost circuit board of outermost circuit boards, the dummy electrode being connected to an outermost electrode of another circuit board.

The plasma addressed electro-optical display according to the present invention may have a structure further including a first substrate having a plurality of discharge electrodes formed thereon; a dielectric layer disposed apart from the first substrate by a predetermined distance; a plasma cell formed by sealing the peripheries of the first substrate and the dielectric layer with a sealing portion; and a second substrate disposed opposite to the dielectric layer and having data electrodes intersecting the discharge electrodes on the surface thereof, wherein the plasma cell and the second substrate are stacked in such a manner that an electro-optical material layer is interposed between the plasma cell and the second substrate so that the plasma addressed electro-optical display is formed.

The plasma addressed electro-optical display according to the present invention may have a structure that the circuit board is a flexible circuit board.

Other objects, features and advantages of the invention will be evident from the following detailed description of the preferred embodiments described in conjunction with the attached drawings.

DETAILED DESCRIPTION OF THE INVENTION

An embodiment of the present invention will now be described with reference to the drawings.

Figure 1:
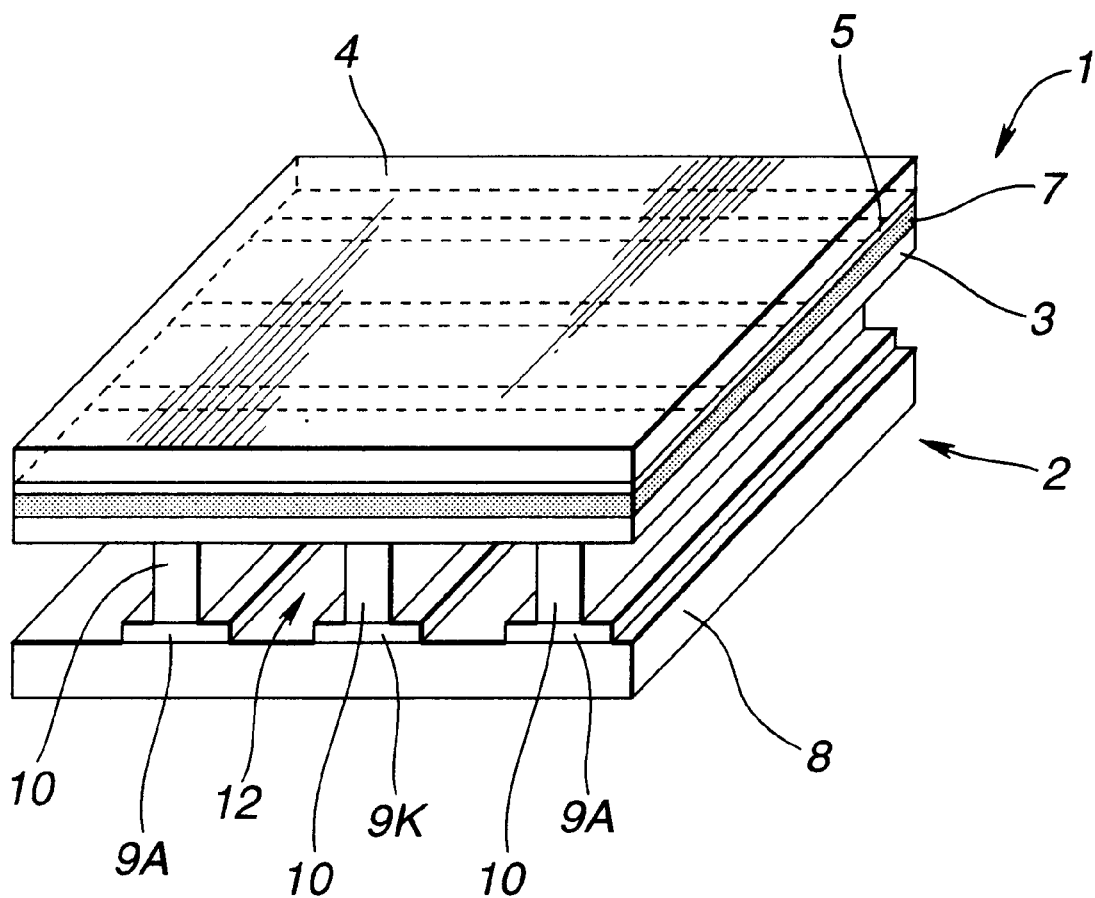
FIG. 1 is a partially-cut schematic perspective view showing the structure of an embodiment of a plasma addressed electro-optical display according to the present invention.
Figure 2:
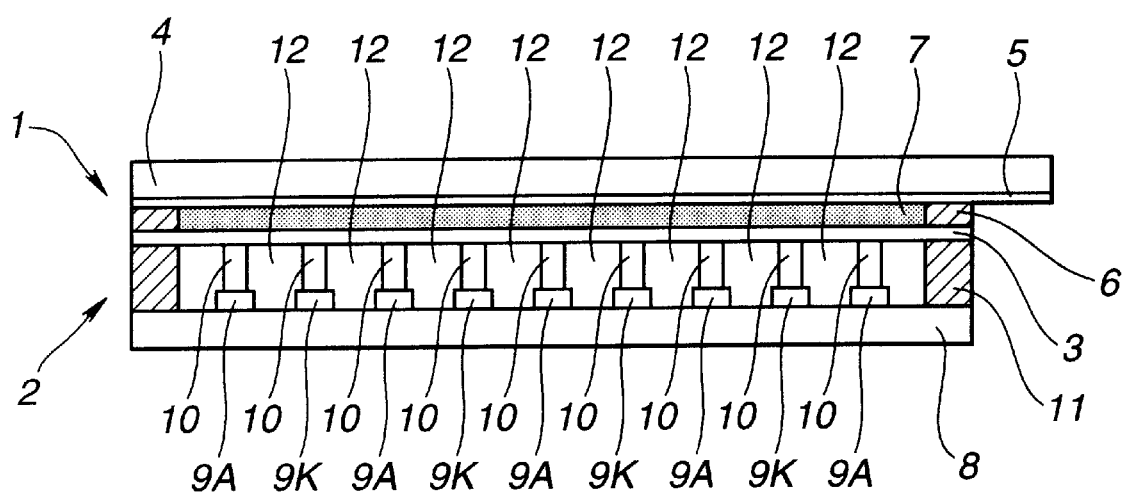
FIG. 2 is a schematic cross sectional view showing the structure of the plasma addressed electro-optical display according to the present invention.

A display panel according to this embodiment has a so-called flat panel structure. The structure is formed into a stacked shape composed of an electro-optical display cell 1, a plasma cell 2 and a dielectric sheet 3, which is interposed between the electro-optical display cell 1 and the plasma cell 2, as shown in FIGS. 1 and 2.

The dielectric sheet 3 is formed by a thin glass plate or the like to serve as a capacitor. Therefore, it is preferable that the thickness of the dielectric sheet 3 is minimized to realize satisfactory electrical coupling between the electro-optical display cell 1 and the plasma cell 2 and to prevent two-dimensional expansion of electrical charges. Specifically, a thin glass plate having a thickness of about 50 $\mu$m is employed.

The electro-optical display cell 1 is manufactured in such a manner that a glass substrate (an upper substrate) 4 having a predetermined distance from the dielectric sheet 3 by virtue of a spacer 6, is joined to the upper surface of the dielectric sheet 3.

A liquid crystal material, which is an electro-optical material, is enclosed in a space between the dielectric sheet 3 and the upper substrate 4. Thus, a liquid crystal layer 7 is formed. Note that the electro-optical material may be a material other than liquid crystal.

The distance from the upper substrate 4 to the dielectric sheet 3 is determined to be, for example, 4 μm to 10 μm, which is maintained substantially uniformly over the display surface.

A plurality of data electrodes 5 made of a transparent conductive material and extending, for example, in a direction of the rows, are disposed on the surface of the upper substrate 4 opposite to the dielectric sheet 3. The data electrodes 5 are, at predetermined intervals, formed in parallel with each other in a direction of columns.

The plasma cell 2 is composed of the dielectric sheet 3 and a glass substrate (a lower substrate) 8 disposed below the dielectric sheet 3.

A plurality of anode electrodes 9A and cathode electrodes 9K extending in a direction perpendicular to the direction of the data electrodes 5, that is, in the direction of the columns are disposed on the surface of the lower substrate 8 opposite to the dielectric sheet 3. The anode electrodes 9A and cathode electrodes 9K are formed in parallel with each other and spaced apart from each other by a predetermined distance to form a discharge electrode group.

Moreover, barrier ribs 10 each having a predetermined width and extending along the anode electrodes 9A and the cathode electrodes 9K are formed on the central portions of the upper surfaces of the anode electrodes 9A and the cathode electrodes 9K. The top end of each of the barrier ribs 10 is in contact with the lower surface of the dielectric sheet 3 so that a substantially constant distance is maintained from the lower substrate 8 to the dielectric sheet 3.

The dielectric sheet 3 is hermetically joined to the lower substrate 8 at an outer periphery thereof by a frit seal 11 formed by low melting point glass and the like. Thus, the plasma cell 2 is formed into a hermetically sealed space. The hermetically sealed space is filled with a gas, ionization of which is permitted, for example, helium gas, neon gas, argon gas or their mixture gas.

The plasma addressed electro-optical display according to this embodiment has a plurality of discharge channels (spaces) 12 formed between the lower substrate 8 and the dielectric sheet 3 and separated from one another by the barrier ribs 10. The discharge channels 12 are formed in parallel with one another in the direction of the rows. The discharge channels 12 intersect the data electrodes 5 at right angles.

Figure 3:
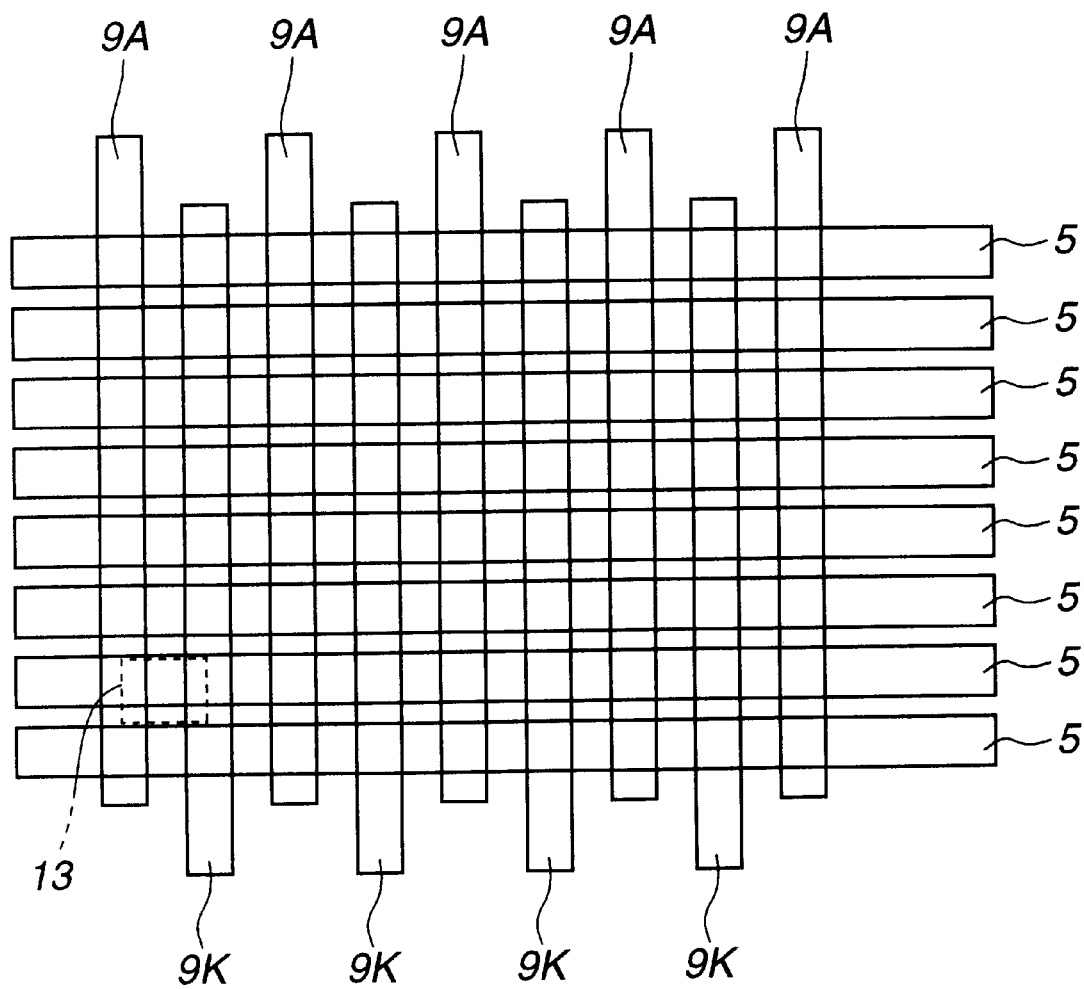
FIG. 3 is a schematic view showing a layout of data electrodes, discharge electrodes and discharge channels.

Therefore, each of the data electrodes 5 serves as a unit for operating the column, while each of the discharge channels 12 serves as a unit for operating the row. As shown in FIG. 3, intersections of the data electrodes 5 and the discharge channels 12 correspond to pixels 13.

In the plasma addressed electro-optical display having the above-mentioned structure, when drive voltage is applied between the anode electrodes 9A and cathode electrodes 9K corresponding to predetermined discharge channels 12, the gas enclosed in the discharge channels 12 is ionized. Thus, plasma discharge takes place and the potentials in the discharge channels 12 are changed to the anode potential.

When data voltage is applied to each of the data electrodes 5 in the foregoing state, the data voltage is written on the liquid crystal layer 7 corresponding to the plural pixels 13 disposed in the direction of the columns to correspond to the discharge channels 12 in which the plasma discharge has taken place.

After the plasma discharge has been completed, the potentials of the discharge channels 12 are left as floating potentials. Thus, the data voltage written on the liquid crystal layer 7 corresponding to the pixels 13 is maintained to a next writing period (for example, one field or one frame after initially being written). In this case, the discharge channels 12 serve as sampling switches and the liquid crystal layer 7 of each of the pixels 13 serves as a sampling capacitor.

The liquid crystal is operated with the data voltage written on the liquid crystal layer 7 so that a display is performed at each pixel 13. Therefore, the liquid crystal layer 7 is operated similarly to the active matrix addressing method when the discharge channels 12 which generate plasma discharge are sequentially scanned and a data voltage is applied to each of the data electrodes 5 in synchronization with the scanning operations. Thus, a two-dimensional display can be performed.

The plasma addressed electro-optical display has the above-mentioned basic structure. The plasma addressed electro-optical display according to this embodiment includes the data electrodes 5 and discharge electrodes (the anode electrodes 9A and cathode electrodes 9K) drawn out in the horizontal and vertical direction to form a matrix configuration.

Figure 4:
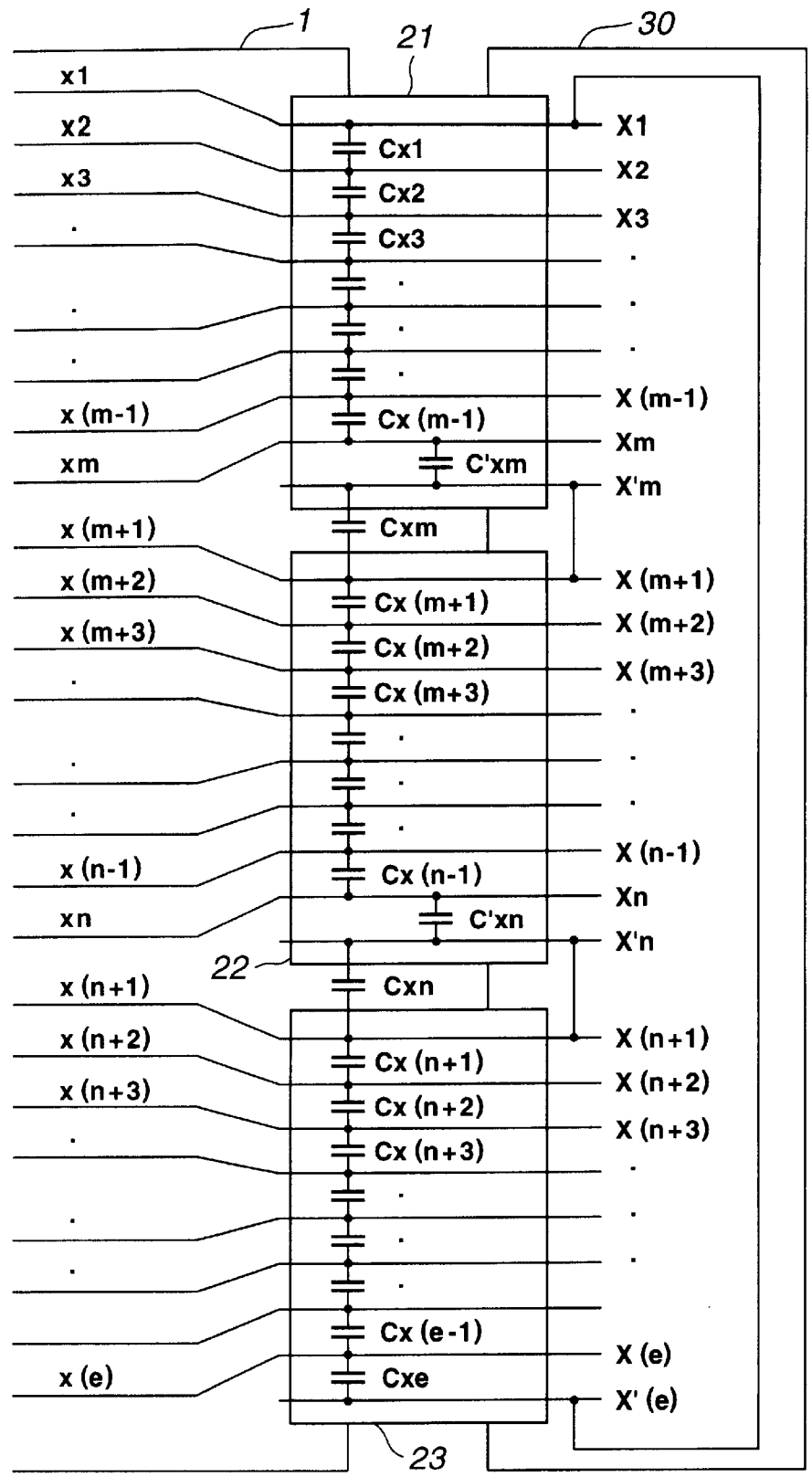
FIG. 4 is a schematic plan view showing a pattern of electrodes on a circuit board.

The foregoing electrodes are, connected through a plurality of flexible circuit boards to the drive substrate on which a driver IC is mounted. That is, the display panel is connected to a drive substrate 30 by a plurality (three in this embodiment) of flexible circuit boards 21, 22 and 23, as shown in FIG. 4. Hereinafter the description will be about only the horizontal electrodes for simplification.

Horizontal electrodes provided for the display panel are expressed in the descending order as $x_1, x_2, x_3, \ldots, x_{(m-1)}, x_m, x_{(m+1)}, \ldots, x_{(n-1)}, x_n, x_{(n+1)}, \ldots, x_e$.

On the other hand, electrodes on each of the flexible circuit boards 21, 22 and 23 are expressed as $x_1, x_2, x_3, \ldots, x_{(m-1)}, x_m, x_{(m+1)}, \ldots, x_{(n-1)}, x_n, x_{(n+1)}, \ldots, x_e$.

The horizontal electrode $x_1$ of the display panel is connected to the electrode $x_1$ of the flexible circuit board 21, the electrode $x_2$ is connected to the electrode $x_2$, and the electrode $x_m$ is connected to the electrode $x_m$. As a result of the sequential connection, electrical connection with the drive substrate 30 is established.

Referring to FIG. 4, the electrodes $x_1$ and $x_m$ are the outermost electrodes on the flexible circuit board 21. Similarly, the electrodes $x_{(m+1)}$ and $x_n$ are the outermost electrodes on the flexible circuit board 22 and the electrodes $x_{(n+1)}$ and $x_e$ are the outermost electrodes on the flexible circuit board 23.

In a usual structure, the outermost electrode on each of the flexible circuit boards 21, 22 and 23 has a ccapacitance smaller than that of the other electrodes.

Accordingly, the embodiment of the present invention has a structure that dummy electrodes $X'_m$ and $X'_n$ are formed on the outsides of the outermost electrodes of the circuit boards adjacent to next circuit boards. The dummy electrodes $X'_m$ and $X'_n$ are connected to outermost electrodes of adjacent circuit boards. Although the electrodes $X'_m$ and $X'_n$ are not required to establish the electrical connection between the display panel P and the drive substrate 30, they contribute to making the coupled capacitances between adjacent electrodes uniform.

The function of the dummy electrodes $X'_m$ and $X'_n$ will now be described.

When the capacitances of adjacent horizontal electrodes $x_1, x_2, \ldots$, are considered, the capacitances are determined by the coupled capacitances among the electrodes $x_1, x_2, \ldots$, of each of the flexible circuit boards 21, 22 and 23. The coupled capacitances is $C_{x1}$ at the electrode $X_1$, $C_{x1}//C_{x2}, \ldots$, at the electrode $x_2$, and the coupled capacitances of adjacent electrodes at the z-th electrode are generalized as $C_{x(z-1)}//C_{xz}$ ($z\neq 1$, e).

The coupled capacitances $C_{xm}$ and $C_{xn}$ of adjacent electrodes at the ends of flexible circuit boards are very small as compared with coupled capacitances of adjacent electrodes in the flexible circuit board. The reason for this lies in that the pitches between electrodes in the foregoing portion is excessively enlarged as compared with those between electrodes in the other portions.

Therefore, the dummy electrodes $X'_m$ and $X'_n$ are provided at the pitch which is the same as that between usual electrodes. Moreover, the dummy electrodes $X'_m$ and $X'_n$ are connected to the electrodes $X_{(m+1)}$ and $X_{(n+1)}$, respectively. As a result, coupled capacitances $C'_{xm}$ and $C'_{xn}$ can be generated so that the coupled capacitances of adjacent electrodes are made to be the same as those of adjacent electrodes in the other portions. As a result, the coupled capacitances $C_{x(z-1)}//C_{xz}$ ($Z\neq 1$, e) can be made to be the same for all of electrodes.

When the dummy electrodes $X'_m$ and $X'_n$ are provided as described above, the coupled capacitances of adjacent drawn-out electrodes of the display panel P can be made uniform. Therefore, the waveforms of signal voltages which are applied from the drive substrate 30 can be made uniform. As a result, the quality of a displayed image can significantly be improved.

When z=1, e are satisfied, a dummy electrode $X'_e$ arranged to be connected to the outermost electrode $X_1$ of the other flexible circuit board 21 is provided on the outside of the outermost electrode of the flexible circuit board 23, as shown in FIG. 4. Thus, a similar effect can be obtained.

Since the above-mentioned portions are the two vertical end portion of the frame, any slight deterioration in the uniformity of the frame is inconspicuous. Therefore, the dummy electrode $X'_e$ is not necessarily be required.

Although the invention has been described for a plasma addressed electro-optical display, the present invention may be applied widely to image displays including a usual liquid crystal display or a flat-panel type display.

As described above, according to the present invention, the coupled capacitances of adjacent electrodes can be made uniform. Thus, a plasma addressed electro-optical display capable of displaying a high-quality image can be provided.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A plasma addressed electro-optical display, comprising:

a display panel having display electrodes;

a plurality of circuit boards connected to said display panel;

a drive substrate connected to said plurality of circuit boards so that said circuit boards are connected between said display panel and said drive substrate;

connecting electrodes on said circuit boards connected between said drive substrate and said display electrodes on said display panel, said connecting electrodes having a predetermined pitch relative to one another, said connecting electrodes producing a first coupling capacitance between adjacent connecting electrodes as a result of said pitch, said connecting electrodes including outermost connecting electrodes adjacent edges of said circuit boards;

a dummy electrode formed adjacent one of said outermost electrodes between said outermost electrode and said edge of said circuit board at said pitch relative to said outermost electrode so as to produce a second coupling capacitance between said dummy electrode and said outermost electrode substantially equal to said first coupling capacitance; and an electrical connection from said dummy electrode on one of said circuit boards to said outermost connecting electrode of a further one of said circuit boards.

2. A plasma addressed electro-optical display according to claim 1, wherein said display panel includes:

a first substrate having a plurality of discharge electrodes formed thereon;

a dielectric layer disposed spaced apart from said first substrate by a predetermined distance;

a plasma cell formed by sealing peripheries of said first substrate and said dielectric layer with a sealing portion; and a second substrate disposed opposite to said dielectric layer and having said display electrodes as data electrodes intersecting said discharge electrodes on a surface of said second substrate;

said plasma cell and said second substrate being stacked in such a manner that an electro-optical material layer is interposed between said plasma cell and said second substrate so that said plasma addressed electro-optical display is formed.

3. A plasma addressed electro-optical display according to claim 2, wherein said circuit board is a flexible circuit board.

* * * * *